(12) United States Patent
Kakuta et al.

(10) Patent No.: US 6,437,634 B1
(45) Date of Patent: Aug. 20, 2002

(54) SEMICONDUCTOR CIRCUIT IN WHICH DISTORTION CAUSED BY CHANGE IN AMBIENT TEMPERATURE IS COMPENSATED

(75) Inventors: Yuji Kakuta; Yoshiaki Fukasawa; Yuichi Taguchi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/195,410

(22) Filed: Nov. 19, 1998

(30) Foreign Application Priority Data

Nov. 27, 1997 (JP) .............................. 9-326444

(51) Int. Cl.[7] .............................................. H03K 3/42
(52) U.S. Cl. ...................................... 327/513; 327/540
(58) Field of Search ................................ 327/309, 310, 327/311, 317–319, 321, 331, 512, 513

(56) References Cited

U.S. PATENT DOCUMENTS

| | | | |
|---|---|---|---|
| 4,011,518 A | 3/1977 | Irvine et al. .................. | 330/23 |
| 4,207,538 A | 6/1980 | Goel .......................... | 330/277 |
| 4,352,053 A | 9/1982 | Oguchi et al. ............... | 323/220 |
| 4,873,490 A | * 10/1989 | Hecht et al. ................. | 327/513 |
| 4,952,865 A | * 8/1990 | Pataut et al. ................. | 327/513 |
| 5,408,697 A | 4/1995 | Price et al. | |
| 5,659,264 A | * 8/1997 | Ariyoshi et al. ............. | 327/513 |
| 5,795,069 A | * 8/1998 | Mattes et al. ................ | 327/513 |

FOREIGN PATENT DOCUMENTS

| | | |
|---|---|---|
| CN | 1098571 A | 8/1995 |
| EP | 351719 | 1/1990 |
| JP | 55-64405 | 5/1980 |
| JP | S56-153810 | 11/1981 |
| JP | 57-157606 | 9/1982 |
| JP | 62-91008 | 4/1987 |
| WO | 97/05695 | 2/1997 |

OTHER PUBLICATIONS

Patent Abstracts of Japan, vol. 016, No. 108 (E–1179), Mar. 17, 1992, & JP 03 283458 A (Hitachi Ltd), Dec. 13, 1991.

* cited by examiner

*Primary Examiner*—Kenneth B. Wells
(74) *Attorney, Agent, or Firm*—Sughrue Mion, PLLC

(57) ABSTRACT

A semiconductor circuit includes an amplifying circuit and compensates the distortion characteristic in the event of changes in the ambient temperature. If the amplifying circuit is a field effect transistor (FET) amplifying circuit having a grounded source, a compensating circuit in which a thermistor having a negative temperature characteristic and a thermistor having a positive temperature characteristic are connected in a series is provided between the grounding point and the source of the FET to compensate distortion of signals outputted from the FET that is caused by the ambient temperature. The temperature at which distortion is considered a minimum is taken as the reference temperature, and the drain current that flows at this reference temperature is made a minimum such that the drain current increases as the ambient temperature deviates from the reference temperature, thereby suppressing or preventing increase in distortion in the event of changes in the ambient temperature.

6 Claims, 5 Drawing Sheets

SEMICONDUCTOR CIRCUIT IN WHICH DISTORTION CAUSED BY CHANGE IN AMBIENT TEMPERATURE IS COMPENSATED

BACKGROUND OF THE INVENTION

1. Field of the Invention

The present invention relates to a semiconductor circuit, and particularly to a semiconductor circuit suitable for use in hybrid ICs (HIC: Hybrid Integrated Circuits) for CATV (cable television).

2. Description of the Related Art

Wideband amplifiers used for amplifying and relaying signals in CATV systems must both provide extremely low-distortion amplification to avoid deterioration of image quality and maintain performance above a predetermined level even under severe outdoor conditions. Wideband amplifiers conventionally used in a CATV system have therefore employed circuits to compensate fluctuations in the gain characteristic caused by changes in ambient temperature. However, variations in ambient temperature affect not only the gain of the amplifier circuit, but the distortion characteristic as well. Each element making up the semiconductor circuit generally has a characteristic whereby distortion increases with rises or falls in temperature from a particular fixed temperature. Although there are circuits that compensate gain with changes in the ambient temperature, no circuits exist for compensating the deterioration in distortion characteristics that accompanies variations in ambient temperature.

SUMMARY OF THE INVENTION

In consideration of the problems of the above-described prior art, the present invention was realized with the object of providing a semiconductor circuit that can compensate distortion in the event of changes in ambient temperature.

The object of the present invention is achieved by a semiconductor circuit comprising an amplifying circuit that amplifies an alternating-current signal and outputs an amplified signal, and a compensating circuit that compensates a distortion of the amplified signal with changes in ambient temperature.

In the present invention, a compensating circuit is typically provided that combines a thermo-sensitive resistance element in which resistance changes in accordance with the ambient temperature with a positive temperature characteristic and another thermo-sensitive resistance element in which resistance changes in accordance with ambient temperature with a negative temperature characteristic to compensate variation in distortion of signals outputted from the amplifying circuit that is caused by changes in ambient temperature. If current flowing at a reference temperature is set at a minimum when combining these thermo-sensitive resistance elements having positive and negative temperature characteristics, the circuit current increases as the ambient temperature falls below the reference temperature, and moreover, increases as the ambient temperature rises above the reference temperature.

Here, distortion in amplification generally decreases when the circuit current of the amplifying circuit increases and increases when the circuit current decreases, and distortion resulting from increase in the circuit current therefore decreases when the ambient temperature changes if changes in distortion arising from changes in temperature of the elements themselves are ignored. Thus, if the reference temperature is set as the temperature at which distortion of each of the elements making up the semiconductor circuit is a minimum, the increase in distortion of the elements themselves resulting from changes in the ambient temperature is canceled by the decrease in distortion resulting from the increase in the circuit current, thereby compensating distortion resulting from changes in ambient temperature.

In the present invention, thermistors can be used as the thermo-sensitive resistance elements.

If thermistors are provided on the input side of the amplifying circuits as the thermo-sensitive resistance elements having a negative temperature characteristic, the Q factor (the quality factor) decreases to the extent that the resistance of the thermistors rises and increases to the extent that the resistance decreases, and the Q factor of the amplifying circuit thus increases as the ambient temperature rises and decreases as the ambient temperature falls. Here, the Q factor is a factor indicating the resonance level. In a semiconductor device, the gain slope becomes moderate as the ambient temperature rises and becomes steep as the ambient temperature falls and gain increases. Arranging a thermistor having a negative temperature characteristic on the input side of the amplifying circuit therefore causes fluctuation in the Q factor with respect to the ambient temperature to be canceled by fluctuation in the gain characteristic with respect to ambient temperature of the gain slope, whereby the slope characteristic of the gain slope is fixed regardless of changes in the ambient temperature.

The above and other objects, features, and advantages of the present invention will become apparent from the following description based on the accompanying drawings which illustrate examples of preferred embodiments of the present invention.

DESCRIPTION OF THE PREFERRED EMBODIMENTS

Elements that make up a semiconductor circuit generally have a characteristic whereby distortion increases as the temperature rises above or falls below a particular temperature. The distortion characteristic also changes with the current that flows through the circuit, the distortion increasing as the current flowing through the circuit decreases and decreasing as the current flowing through the circuit increases. Controlling the current flowing through the circuit thus enables control of the degree of distortion with respect to the ambient temperature.

Figure 1:
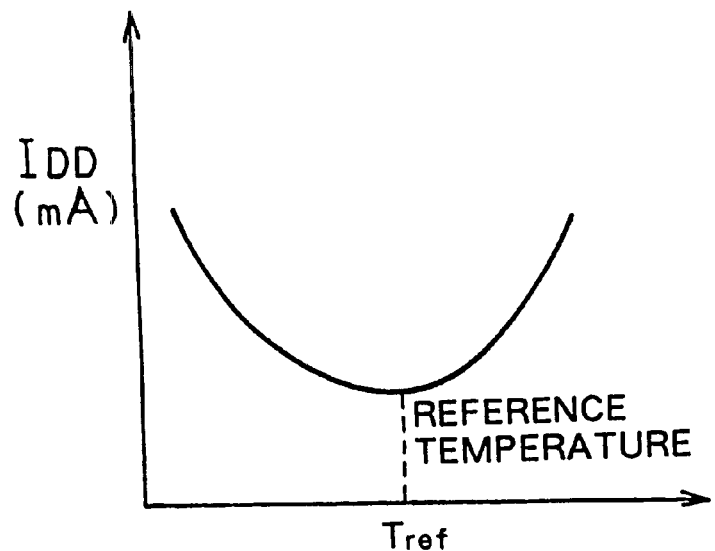
FIG. 1 is a graph illustrating the principle for controlling increase in distortion with respect to ambient temperature in the present invention.

As shown in FIG. 1, a case is considered in which current $I_{DD}$ flowing through a circuit is set to a minimum at a particular fixed reference temperature $T_{ref}$ and raised as the ambient temperature rises above or falls below the reference temperature. In such a case, the element characteristics bring about an increase in distortion as the temperature rises or falls with respect to a particular fixed temperature, but distortion is also decreased because the current flowing through the circuit increases as the temperature rises or falls with respect to the particular fixed temperature, and the change in distortion is thus canceled. Increase in distortion in cases in which the ambient temperature rises or falls with respect to a particular fixed temperature can therefore be controlled.

In this case, thermistors are employed as the thermo-sensitive resistance elements to control the current flowing through the circuit in accordance with the ambient temperature.

Figure 2:
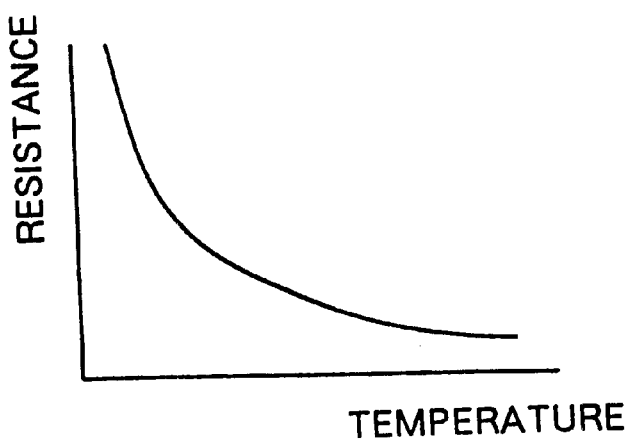
FIG. 2 is a graph for illustrating the characteristics of a thermistor having a negative temperature characteristic.

FIG. 2 is provided to illustrate a typical temperature-to-resistance characteristic of a thermistor having a negative temperature characteristic. As shown in this figure, the resistance of a thermistor having a negative temperature characteristic decreases as the ambient temperature rises, and the flow of current thus increases. In a semiconductor circuit having the above-described distortion characteristic, therefore, the use of a thermistor having a negative temperature characteristic causes a reduction in distortion due to the increase in the flow of current at temperatures higher than the temperature of minimum distortion, but further causes an increase in distortion due to the decrease in the flow of current at temperatures lower than the temperature of minimum distortion.

Figure 3:
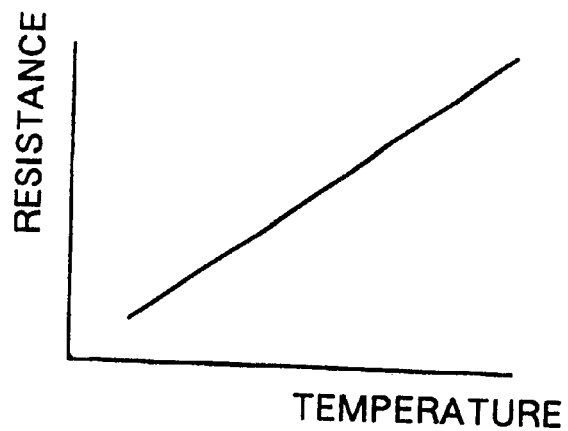
FIG. 3 is a graph for illustrating the characteristics of a thermistor having a positive temperature characteristic.

FIG. 3 is a graph showing a typical temperature-to-resistance characteristic for a thermistor having a positive temperature characteristic. As shown in this figure, the resistance of a thermistor having a positive temperature characteristic increases as the ambient temperature increases, and the flow of current thus decreases. The use of a thermistor having a positive temperature characteristic in a semiconductor circuit having the above-described distortion characteristic therefore results in a decrease in distortion at temperatures lower than the temperature of minimum distortion due to the increase in the current flow, but also results in an increase in skew at temperatures higher than the temperature of minimum distortion due to the decrease in current flow.

The inventors of the present invention have therefore realized the relation between the ambient temperature and the circuit current shown in FIG. 1 by combining a thermo-sensitive resistance element having a positive temperature coefficient with another thermo-sensitive resistance element having a negative temperature coefficient.

First Embodiment

Figure 4:
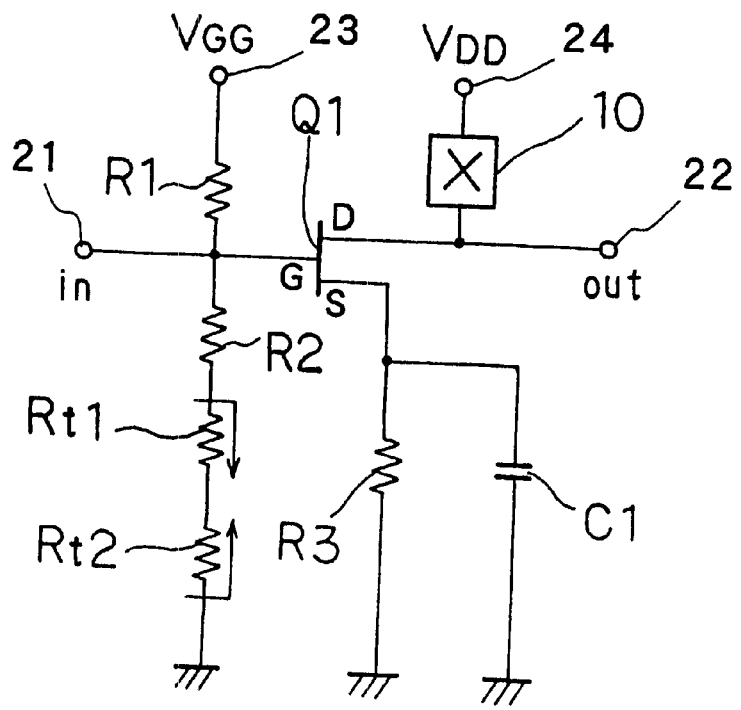
FIG. 4 is a circuit diagram showing the configuration of a semiconductor circuit according to a first embodiment of the present invention.

FIG. 4 shows the configuration of the semiconductor circuit according to a first embodiment of the present invention. FIG. 4 shows only the alternating-current circuit portion of the semiconductor circuit, and shows an amplifying circuit that employs a single FET (field effect transistor).

Gate G of FET Q is connected to input terminal 21, and drain D is connected to output terminal 22. Resistor R1 is inserted between gate G of FET Q1 and supply terminal 23 of gate bias voltage $V_{GG}$, and high-impedance circuit 10 is inserted between drain D of FET Q1 and supply terminal 24 of drain voltage $V_{DD}$. High-impedance circuit 10 is a circuit having high impedance as an alternating-current circuit but having low resistance with respect to direct current to supply drain current $I_{DD}$. Resistor R3 and capacitor C1 are provided in parallel between source S of FET Q1 and the grounding point. In addition, resistor R2 and thermistors Rt1 and Rt2 connected in a series are provided between gate G of FET Q1 and the grounding point.

Thermistor Rt1 is a thermo-sensitive resistance element having a negative temperature characteristic such as shown in FIG. 2 and thermistor Rt2 is a thermo-sensitive resistance element having a positive temperature characteristic such as shown in FIG. 3.

If thermistor Rt1 having a negative temperature characteristic and thermistor Rt2 having a positive temperature characteristic are connected in series as shown in FIG. 4, the resistance of this serial circuit exhibits a V-shaped temperature characteristic in which resistance is at a minimum at a particular temperature and increases with distance from this temperature. The bias voltage applied to the gate of FET Q1 therefore also exhibits a V-shaped temperature characteristic having a minimum at that temperature, and the drain current $I_{DD}$ of FET Q1 also exhibits a V-shaped temperature characteristic having a minimum at that temperature.

If thermistor Rt1 and thermistor Rt2 are combined such that the circuit current becomes a minimum in the vicinity of a preset reference temperature, the current flowing through the circuit becomes a minimum at the reference temperature, and the current flowing through the circuit increases as the temperature rises above or falls below the reference temperature as shown in FIG. 1. Distortion thus decreases as the temperature rises above or falls below the reference temperature, thereby suppressing or preventing increase in distortion in the event of changes in the ambient temperature.

For the distortion characteristic in HIC amplifiers for CATV systems, deterioration of distortion typically must be suppressed to within 2–3 dB or less with respect to distortion at 30° C. for a temperature range of from −30 to 100° C. The distortion characteristic is proportional to the circuit current, but this circuit current changes in proportion to the ambient temperature in amplifiers of the prior art, with the result that the distortion characteristic deteriorates by more than 2–3 dB when the ambient temperature rises.

In response to this problem, a thermistor having a positive temperature characteristic is combined with another thermistor having a negative temperature characteristic such that the current reaches a minimum in the vicinity of 30° C., the circuit current increasing with a fall in the ambient temperature from 30° C., and moreover, the circuit current increasing with a rise in the ambient temperature from 30° C. The amount of deterioration in the distortion characteristic in the event of changes in ambient temperature with respect to the distortion characteristic at an ambient temperature of 30° C. can thus be limited or prevented.

Figure 5:
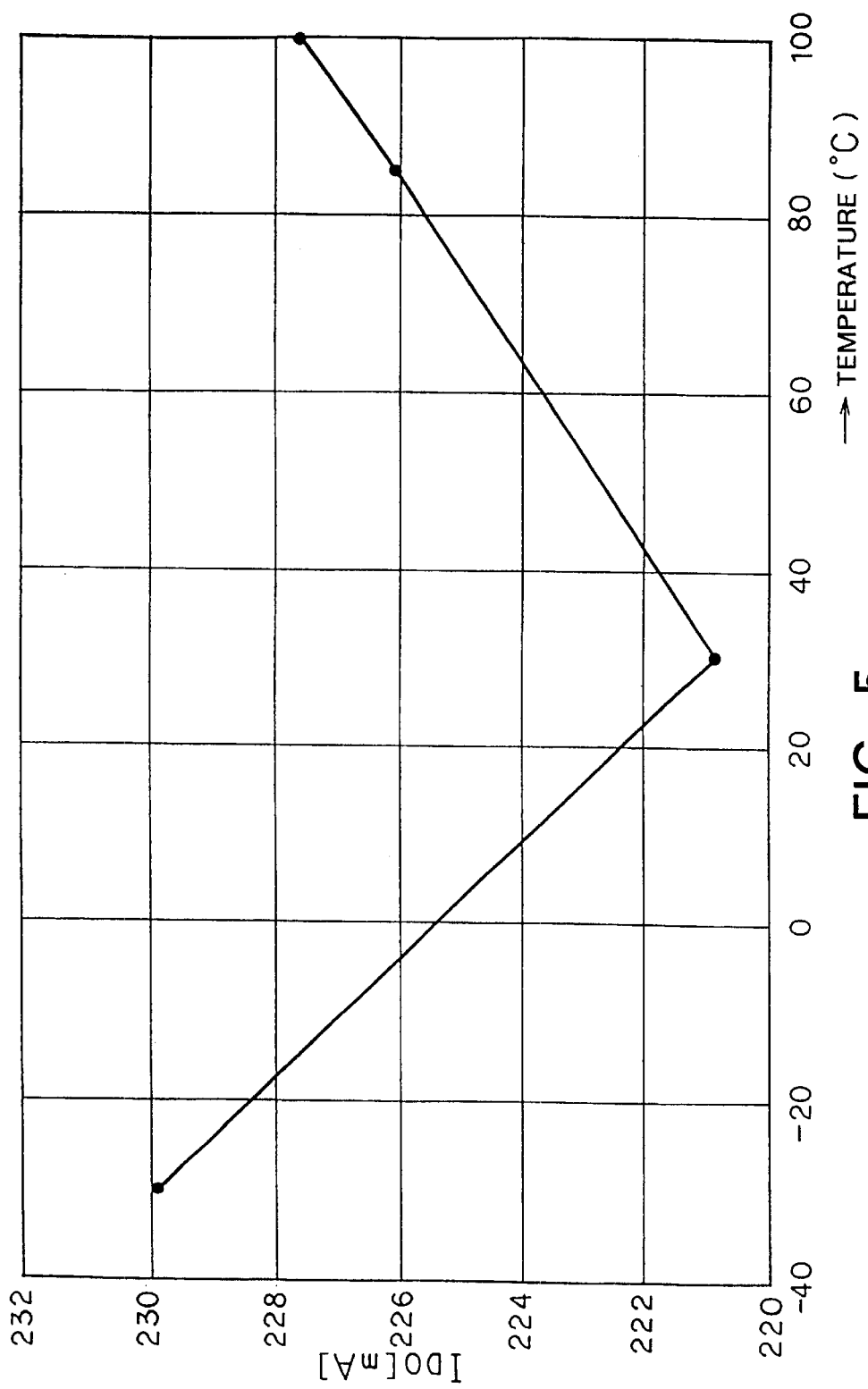
FIG. 5 is a graph showing the temperature characteristics of circuit current in an HIC amplifier for a CATV system for a case in which a thermistor having a positive temperature characteristic is combined with a thermistor having a negative temperature characteristic such that the circuit current becomes a minimum in the vicinity of the reference temperature.

FIG. 5 shows the temperature characteristic of circuit current in an HIC amplifier for a CATV system for a case in which a thermistor having a positive temperature characteristic is combined with a thermistor having a negative temperature characteristic such that the circuit current is a minimum in the vicinity of the reference temperature. Here, the temperature that serves as the reference of characteristics is set to 30° C.

As shown in FIG. 5, the circuit current is a minimum at 30° C., and both increases as the ambient temperature falls below 30° C. and increases as the ambient temperature rises above 30° C. The circuit current thus exhibits a V-shaped characteristic that takes 30° C. as the minimum point.

Second Embodiment

Figure 6:
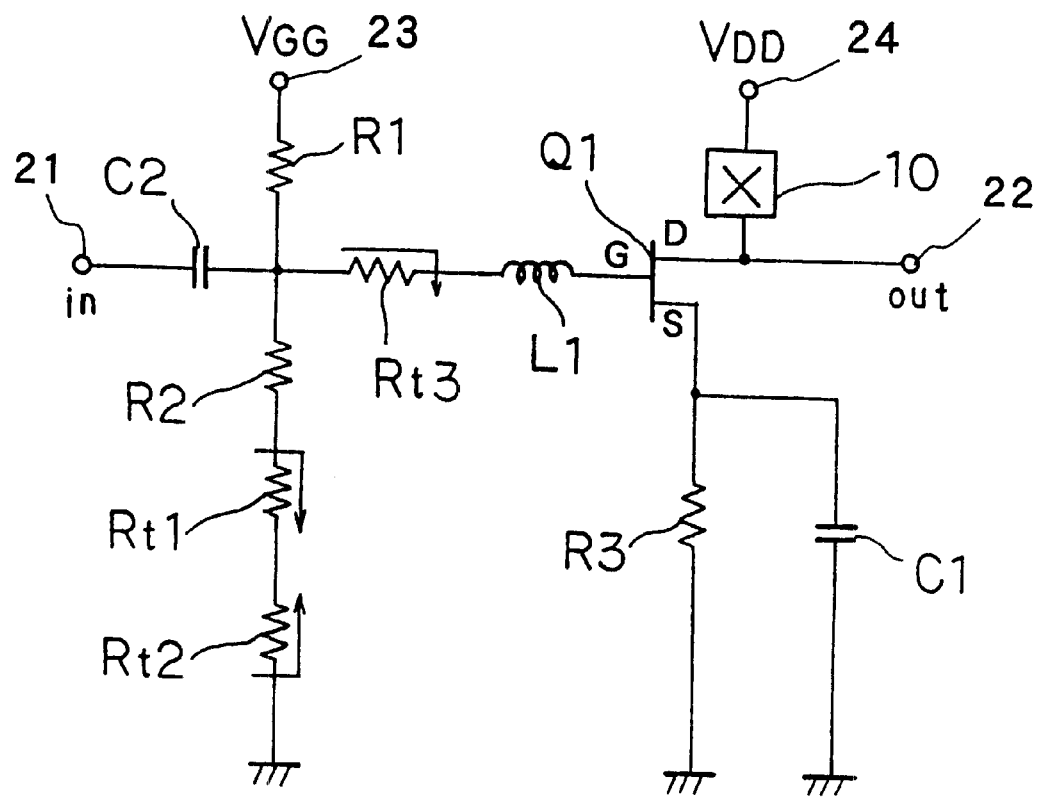
FIG. 6 is a circuit diagram showing the configuration of a semiconductor circuit according to a second embodiment of the present invention.

FIG. 6 shows the configuration of the semiconductor circuit according to a second embodiment of the present invention. FIG. 6 shows only the alternating-current circuit portion of the semiconductor circuit, and shows an amplifying circuit that employs a single FET (field effect transistor).

In this amplifying circuit, capacitor C2 is provided between input terminal 21 and the connection point between resistors R1 and R2, and in addition, thermistor Rt3 having a negative temperature characteristic and inductor L1 connected in a series are inserted between the gate of FET Q1 and the connection point between resistors R1 and R2 in the circuit shown in FIG. 4.

In a semiconductor circuit configured as described above, the resistance of thermistor Rt3 decreases when the ambient temperature rises, and the resistance of thermistor Rt3 increases when the ambient temperature falls.

The Q factor, which is a factor indicating the level of the resonance point in a typical resonant circuit, decreases to the degree that the resistance of thermistor Rt3 increases and increases to the degree that the resistance of thermistor Rt3 decreases, and the Q factor therefore increases when the ambient temperature rises and decreases when the ambient temperature falls. In addition, in a circuit that realizes a gain slope, the gain slope becomes moderate when the ambient temperature rises, but gain increases and the gain slope becomes steep when the ambient temperature falls. The circuit shown in FIG. 6, therefore functions such that fluctuation in the Q factor with respect to the ambient temperature is canceled by fluctuation in the gain slope of the gain characteristic with respect to the ambient temperature, and the slope characteristic of the gain slope is therefore fixed despite changes in the ambient temperature.

Inductor L1 may also be constituted by the bonding wire or conductive pattern that connects the gate of FET Q1 and thermistor Rt3.

Third Embodiment

Figure 7:
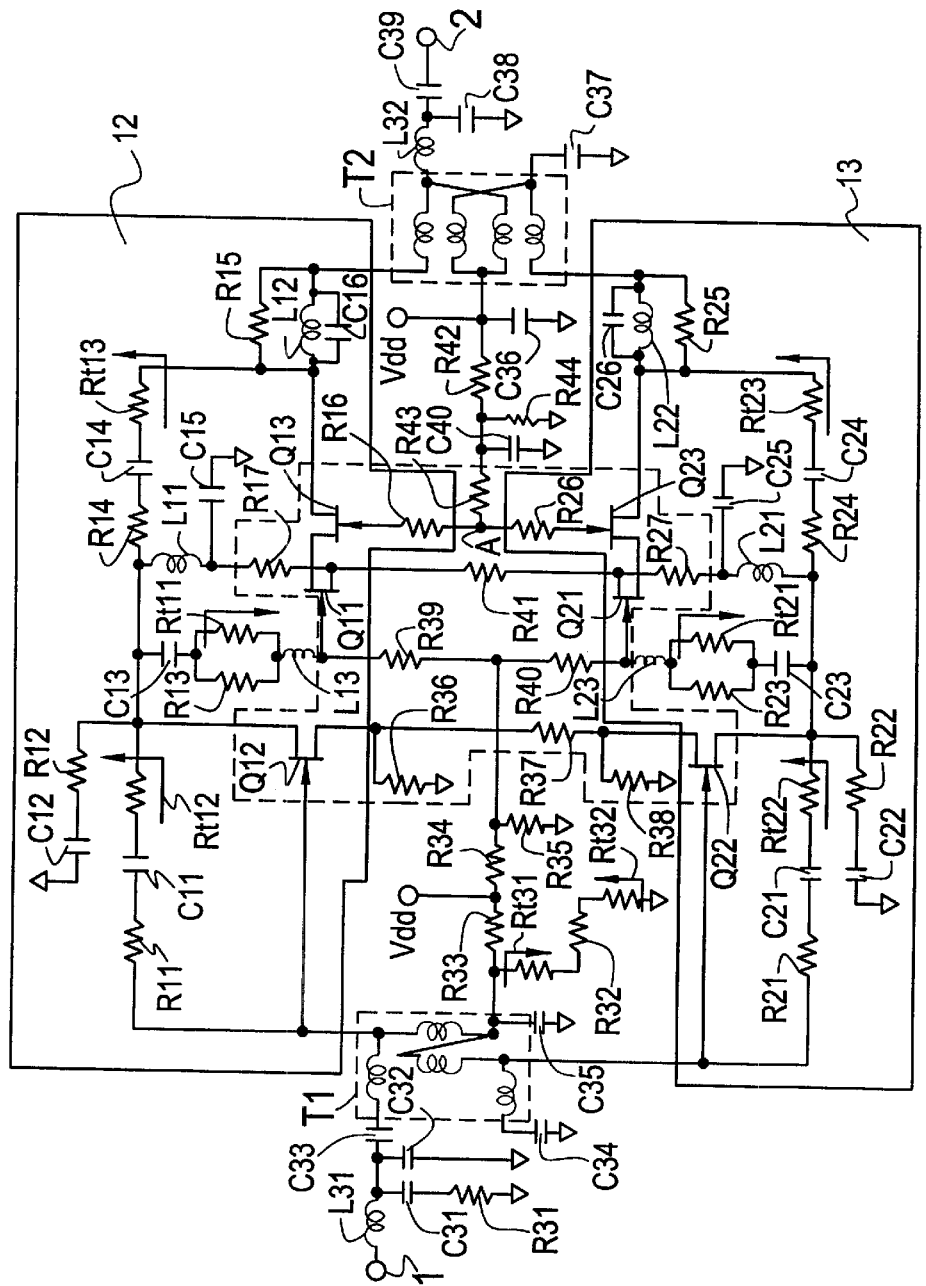
FIG. 7 is a circuit diagram showing the configuration of a semiconductor circuit according to a third embodiment of the present invention.

In the semiconductor circuit according to a third embodiment of the present invention shown in FIG. 7, the signal inputted to input terminal 1 is divided into two signals, the two divided signals are respectively amplified by amplifying circuits 12 and 13, and the signals amplified at amplifying circuits 12 and 13 are then combined and outputted.

Transformer T1 grounded by way of capacitors C34 and C35 is provided as the divider that divides the signal inputted by way of input terminal 1 into two signals of differing phase. Transformer T2 grounded by way of capacitor C37 is provided as the combiner that combines the two signals amplified by amplifying circuits 12 and 13 into one signal.

Amplifying circuit 12 comprises FETs Q11–Q13 connected in multiple stages. In amplifying circuit 12, thermistor Rt11 and resistor R13, which are connected together in parallel, are provided as the gate resistance of FET Q11, which is the second-stage FET, and inductor L13 is inserted between this gate resistance and the gate of FET Q11. Resistor R11, capacitor C11 and thermistor Rt12 are connected in a series between the gate and drain of FET Q12, which is the first stage of amplifying circuit 12. The drain of FET Q12 is connected to a prescribed potential point by way of resistor R12 and capacitor C12 connected together in a series, and further, is connected to the gate resistance (i.e., thermistor Rt11 and resistor R13) of FET Q11 by way of capacitor C13, and finally, is connected to the source of FET Q11 by way of inductor L11 and resistor R17 connected in series. The connection point between inductor L11 and resistor R17 is connected to the prescribed potential point by way of capacitor C15.

Resistor R14, capacitor C14 and thermistor Rt13 are provided in a series between the drain of FET Q12 and the drain of FET Q13. Resistor R16 is connected to the gate of FET Q13. Resistor R15, inductor L12 and capacitor C16 connected together in parallel are provided between the drain of FET Q13 and the output terminal of amplifying circuit 12. The source of FET Q13 is connected to the drain of FET Q11.

Amplifying circuit 13 is configured the same as amplifying circuit 12, being provided with FETs Q21–Q23 connected in multiple stages and being further provided with resistors R21–R27, thermistors Rt21–Rt23, capacitors C21–C26 and inductors L21–L24 that respectively correspond to resistors R11–R17, thermistors Rt11–Rt13, capacitors C11–C16 and inductors L11–L14 of amplifying circuit 12. FETs Q21–Q23 correspond to FETs Q11–Q13, respectively, of amplifying circuit 12.

The gate of FET Q13 of amplifying circuit 12 is connected to the gate of FET Q23 of amplifying circuit 13 by way of resistors R16 and R26.

On the input side of transformer T1, capacitor C33 and inductor L31 connected in a series are provided between transformer T1 and input terminal 1, and the connection point between capacitor C33 and inductor L31 is connected to a prescribed potential point by way of capacitor C31 and resistor R31 connected in a series. The connection point between capacitor C33 and inductor L31 is connected to the prescribed potential point by way of capacitor C32.

On the output side of transformer T2, inductor L32 and capacitor C39 connected in a series are provided between transformer T2 and output terminal 2, and the connection point between inductor L32 and capacitor C39 is connected to the prescribed potential point by way of capacitor C38.

The source of FET Q11 of amplifying circuit 12 and the source of FET Q13 of amplifying circuit 13 are connected by way of resistor R41, and the gate of FET Q11 is coupled to the gate of FET Q21 by way of serially connected resistors R39 and R40. Resistors R33 and R34 are serially connected and inserted between transformer T1 and the midpoint between resistors R39 and R40. Power supply voltage $V_{dd}$ is supplied to the connection point between resistors R33 and R34. The connection point between resistor R33 and transformer T1 is connected to the prescribed potential point by way of resistor R32 and thermistors Rt31 and Rt32 provided in a series, and the midpoint between resistors R39 and R40 is connected to the prescribed potential point by way of resistor R35.

The source of FET Q12 is connected to the prescribed potential point by way of resistor R36, and the source of FET Q22 is connected to the prescribed potential point by way of resistor R38, the sources of these FETs Q12 and Q22 being connected together by way of resistor R37. Resistor R16, which is the gate resistance of FET Q13, and resistor R26, which is the gate resistance of FET Q23, are connected together at point A, and serially connected resistors R42 and R43 are provided between point A and transformer T2. Resistor R44 and capacitor C40 connected in parallel are provided between the prescribed potential point and the connection point between resistor R42 and resistor R43. The power supply voltage Vdd is supplied to the connection point between resistor R42 and transformer T2, and capacitor C36 is provided between this connection point and the prescribed potential point.

Here, thermistors Rt11, Rt21 and Rt31 are thermo-sensitive resistance elements in which resistance changes in accordance with the ambient temperature with a negative temperature characteristic; and thermistors Rt12, Rt13, Rt22, Rt23 and Rt32 are all thermo-sensitive resistance elements in which resistance changes in accordance with the ambient temperature with a positive temperature characteristic.

In a semiconductor circuit configured according to the foregoing description, thermistor Rt31 having a negative temperature characteristic is combined with thermistor Rt32 having a positive temperature characteristic and these thermistors Rt31 and Rt32 are provided as the resistance that controls the gate potential of FETs Q11 and Q12, whereby the current flowing through the circuit is a minimum at a preset reference temperature and the current flowing through the circuit increases as the temperature rises above or falls below the reference temperature. Here, "current flowing through the circuit" is the drain current of FETs Q11 and Q12.

Distortion therefore decreases as the temperature rises above or falls below the reference temperature, whereby the distortion in the event of change in ambient temperature is compensated.

In this semiconductor circuit, thermistors RT11 and Rt12 having a negative temperature characteristic are provided as the gate resistances of FETs Q11 and Q21, respectively. In amplifying circuit 12, fluctuation in the gain slope of the gain characteristic with respect to the ambient temperature that is generated by the resonant circuit constituted by inductor L12 and capacitor C16 is thus canceled by fluctuation in the Q factor with respect to the ambient temperature in the circuit made up by capacitor C13, thermistor RT11 and inductor L13. The slope characteristic of the gain slope outputted from amplifying circuit 12 is thus fixed despite changes in the ambient temperature. The slope characteristic of the gain slope outputted from amplifying circuit 13 is similarly fixed in the event of changes in the ambient temperature.

Here, inductor L12 and capacitor C16 along with inductor L22 and capacitor C26 that constitute the resonant circuits that generate the gain slope are each provided outside the feedback loops. Change in impedance therefore occurs only on the output side and correction of impedance can be easily achieved.

In the above-described semiconductor circuit, resistor R43 having a resistance of 10~100Ω is provided between resistor R42 and the connection point between resistor R16 and resistor R26, and capacitor C40 is provided between the prescribed potential point and the connection point between resistors R42 and R43, the circuit constants of these elements being set in accordance with termination conditions. Fluctuation in potential is thus absorbed by resistor R43 in the event of fluctuation in potential at point A in the figure and a standing wave is not generated, thereby enabling prevention of deterioration in even order distortion [particularly CSO (composite second order) distortion)] that arises from a standing wave.

While preferred embodiments of the present invention have been described using specific terms, such description is for illustrative purposes only, and it is to be understood that changes and variations may be made without departing from the spirit or scope of the following claims.

What is claimed is:

1. A semiconductor circuit comprising:
    an amplifying circuit that amplifies alternating-current signal and outputs an amplified signal; and
    a compensating circuit that controls a circuit current of said amplifying circuit to be at a minimum at a predetermined reference temperature, and compensates distortion of the amplified signal due to changes in ambient temperature, wherein
    said compensating circuit comprises:
        a first thermo-sensitive resistance element in which resistance changes according to ambient temperature with a positive temperature characteristic; and
        a second thermo-sensitive resistance element in which resistance changes according to ambient temperature with negative temperature characteristic, said first and second thermo-sensitive resistance elements being connected in series;
    said semiconductor circuit further comprising a third thermo-sensitive resistance element in which resistance changes according to ambient temperature on an input side of said amplifying circuit.

2. A semiconductor circuit according to claim 1 wherein said third thermo-sensitive resistance element is a thermo-sensitive resistance element in which resistance changes with a negative temperature characteristic according to ambient temperature.

3. A semiconductor circuit according to claim 2 wherein said third thermo-sensitive resistance element is a thermistor.

4. A semiconductor according to claim 1 wherein each of said thermo-sensitive resistance elements is a thermistor.

5. A semiconductor circuit according to claim 1 wherein said amplifying circuit includes a field effect transistor having its source grounded, said compensating circuit is provided between a gate of said field effect transistor and a grounding point, and said circuit current is a drain current of said field effect transistor.

6. A semiconductor circuit comprising:
    an amplifying circuit that amplifies alternating-current signal and outputs an amplified signal; and
    a compensating circuit that controls a circuit current of said amplifying circuit to be at a minimum at a predetermined reference temperature, and compensates distortion of the amplified signal due to changes in ambient temperature,
    wherein said compensating circuit comprises: a first thermo-sensitive resistance element in which resistance changes according to ambient temperature with a positive temperature characteristic; and a second thermo-sensitive resistance element in which resistance changes according to ambient temperature with negative temperature characteristic, said first and second thermo-sensitive resistance elements being connected in series;
    wherein said amplifying circuit includes a field effect transistor having its source grounded, said compensating circuit is provided between a gate of said field effect transistor and a grounding point, and said circuit current is a drain current of said field effect transistor;

wherein each of said first and second thermo-sensitive resistance elements is a thermistor; and wherein said semiconductor circuit further comprises a third thermo-sensitive resistance element, in which resistance changes with a negative temperature characteristic according to ambient temperature, inserted between said gate and said compensating circuit, wherein an input signal is impressed to a connection point between said third thermo-sensitive resistance element and said compensating circuit.

* * * * *

UNITED STATES PATENT AND TRADEMARK OFFICE
CERTIFICATE OF CORRECTION

PATENT NO.    : 6,437,634 B1
DATED         : August 20, 2002
INVENTOR(S)   : Yuji Kakuta, Yoshiaki Fukasawa and Yuichi Taguchi It is certified that error appears in the above-identified patent and that said Letters Patent is hereby corrected as shown below:

<u>Column 7,</u>
Line 7, delete "Vdd" insert -- $V_{dd}$ --;
Lines 36 and 44, delete "RT11" insert -- Rt11 --.

Signed and Sealed this

Fourth Day of February, 2003

JAMES E. ROGAN
*Director of the United States Patent and Trademark Office*